United States Patent [19]

McIntyre

[11] Patent Number: 5,757,814
[45] Date of Patent: May 26, 1998

[54] MEMORY AND TEST METHOD THEREFOR

[75] Inventor: David H. McIntyre, Bishopston, United Kingdom

[73] Assignee: SGS-Thomson Microelectronics Limited, Almondsbury Bristol, United Kingdom

[21] Appl. No.: 519,406

[22] Filed: Aug. 24, 1995

[30] Foreign Application Priority Data

Aug. 26, 1994 [GB] United Kingdom ............... 9417269

[51] Int. Cl.$^6$ ....................................... G06F 11/00
[52] U.S. Cl. ................. 371/21.1; 371/10.2; 365/201
[58] Field of Search ..................... 371/21.1, 21.2, 371/10.2, 10.3; 395/182.04, 183.01, 183.05, 183.06, 183.18; 365/200, 201

[56] References Cited

U.S. PATENT DOCUMENTS

| | | | |
|---|---|---|---|
| 4,796,233 | 1/1989 | Awaya et al. | 365/200 |
| 4,803,656 | 2/1989 | Takemae | 365/200 |
| 5,046,046 | 9/1991 | Sweda et al. | 365/200 |
| 5,300,840 | 4/1994 | Drouot | 307/530 |
| 5,402,377 | 3/1995 | Ohhata et al. | 365/200 |
| 5,424,987 | 6/1995 | Matsui | 365/200 |
| 5,436,912 | 7/1995 | Lustig | 371/21.6 |
| 5,485,424 | 1/1996 | Kawamura | 365/200 |
| 5,506,807 | 4/1996 | Ferrant et al. | 365/200 |
| 5,535,161 | 7/1996 | Kato | 365/200 |
| 5,550,394 | 8/1996 | Sukegawa et al. | 257/209 |
| 5,555,522 | 9/1996 | Amami et al. | 365/200 |
| 5,559,741 | 9/1996 | Sobue | 365/200 |
| 5,566,114 | 10/1996 | Pascucci et al. | 365/200 |
| 5,617,365 | 4/1997 | Horiguchi et al. | 365/200 |
| 5,627,780 | 5/1997 | Malhi | 365/185.09 |
| 5,627,963 | 5/1997 | Gabillard et al. | 395/183 |
| 5,659,509 | 8/1997 | Golla et al. | 365/200 |

FOREIGN PATENT DOCUMENTS

| | | | |
|---|---|---|---|
| 0 208 555 | 1/1987 | European Pat. Off. | G06F 11/20 |
| 0 578 327 | 1/1994 | European Pat. Off. | G11C 29/00 |
| 61-120399 | 6/1986 | Japan | G11C 29/00 |
| 61-120400 | 6/1986 | Japan | G11C 29/00 |
| 59895 | 3/1991 | Japan . | |
| 243386 | 9/1993 | Japan . | |

OTHER PUBLICATIONS

Office Action from Japanese Patent Application 214493/1995.

*Primary Examiner*—Albert Decady
*Attorney, Agent, or Firm*—Wolf, Greenfield & Sacks, P.C.

[57] ABSTRACT

A redundancy implementation circuit has a set of memory cells each storing an address bit of an address identifying a redundant memory location and a set of comparator circuits each connected to compare the address bit stored in a memory cell with an incoming address bit. A switch selectively connects the output of the memory cell to a redundant address line supplying the incoming address bit during a test mode. A redundant address line driver is activated for supplying an incoming address bit onto the redundant address line in a normal mode, and a test line output driver is connected to the redundant address line in a test mode for utilising the redundant address line to supply test signals onto a test path.

26 Claims, 3 Drawing Sheets

MEMORY AND TEST METHOD THEREFOR

FIELD OF THE INVENTION

This invention relates to a memory and a method of testing a memory.

BACKGROUND TO THE INVENTION

The invention is particularly but not exclusively concerned with flash EPROMs (electrically programmable read only memories) which comprise a plurality of memory cells. These memory cells include programmable and erasable floating gate single transistor memory cells and other cells which can be programmed only once, referred to herein as UPROM (unerasable programmable read only memory) cells. For implementing redundancy on a flash EPROM, these UPROM cells contain respective bits identifying a redundant address. As is well known in the art, the bit in each UPROM cell is compared with a respective address bit to detect if an incoming address matches the address to be repaired stored in the UPROM cells.

FIG. 1 illustrates a redundancy implementation circuit according to the prior art. FIG. 1 illustrates a plurality of address pads A0,A1,A2,A3 for receiving address bits. The address pads A0 ... A3 are each connected to a line driver $4_0 \ldots 4_3$ for driving the address bits onto redundant address lines via an address bus 31. Two groups of redundant address lines are shown in FIG. 1, GROUP0,GROUP1. They are denoted $RAL_{00},RAL_{01}$ etc. in GROUP0 and $RAL_{10},RAL_{11}$ etc. in GROUP1. It can be seen that redundant address lines $RAL_{00},RAL_{10}$ share a common address line AL0 connected to pad A0 and that this also occurs for other pairs of redundant address lines in the groups. The redundant address lines are connected to respective comparators, 8a,8b,8c,8d, four of which are shown in FIG. 1 in each group. It will be appreciated that there may be any different number of comparators depending on the number of bits in the address. The comparators 8a to 8d compare the address bits on redundant address lines RAL with the outputs from a corresponding plurality of memory cells 10a,10b,10c,10d. In a flash memory, these memory cells will normally be UPROM cells. Each UPROM cell 10a to 10d has an output line 12a to 12d respectively on which the bit stored in that memory cell is output for comparison at the comparator 8a to 8d.

The outputs of the comparators 8a to 8d in each group are fed to respective compare circuits $14_0,14_1$ which generate a hit signal HIT0,HIT1 when all of the bits stored in the memory elements 10a to 10d match the incoming bits of the redundant address. The hit signals are supplied on line $16_0,16_1$ to decoding logic to access a spare element in a memory array rather than a defective element when the incoming address is the address of a defective element.

It is clearly desirable to test the data stored in the memory cells 10a to 10d after they have been programmed and before the chip is used. With the prior art circuit of FIG. 1 this is done by examining the hit signals HIT0,HIT1 for a plurality of incoming addresses. However, to test the chip properly, it can be necessary to cycle through all possible addresses if the expected result is not attained because it is difficult to know which of the particular memory cells 10a to 10d is at fault without trying all possible addresses.

An alternative would be to supply the outputs on line 12a to 12d individually to a test bus for the chip. This would enable the output of each memory cell 10a to 10d to be individually examined during a test, but it proliferates the number of wires which are required on the chip.

The present invention seeks to provide a redundancy implementation circuit which can readily be tested but which minimises the number of connections which need to be routed in layout, in order to minimise the chip area.

SUMMARY OF THE INVENTION

According to the present invention there is provided a redundancy implementation circuit comprising: a memory cell storing an address bit of an address identifying a redundant memory location; a comparator circuit connected to compare the address bit stored in the memory cell with an incoming address bit supplied on a redundant address line; a switch for selectively connecting the output of the memory cell to said redundant address line during a test mode; a redundant address line driver activated for supplying an incoming address bit onto said redundant address line in a normal mode; and a test line output driver connectable to said redundant address line in a test mode for driving signals on said redundant address line onto a test path when said redundant address line drivers are not activated.

The test path may be a test bus or any other suitable test path.

The provision of the switch allows the redundant address line to perform a dual function of supplying address bits or outputting stored bits for test, so that the chip area consumed is reduced, while nevertheless allowing the output of each memory cell to be tested individually.

The concept of the invention can also be extended to include memory cells which do not store redundant address bits but which nevertheless store bits which are required to be tested. The output of these memory cells can be connected through appropriate switches to the redundant address lines in the same manner as the outputs of memory cells containing redundant address bits.

For a better understanding of the present invention and to show how the same may be carried into effect reference will now be made by way of example to the accompanying drawings.

DESCRIPTION OF THE PREFERRED EMBODIMENT

Figure 1:
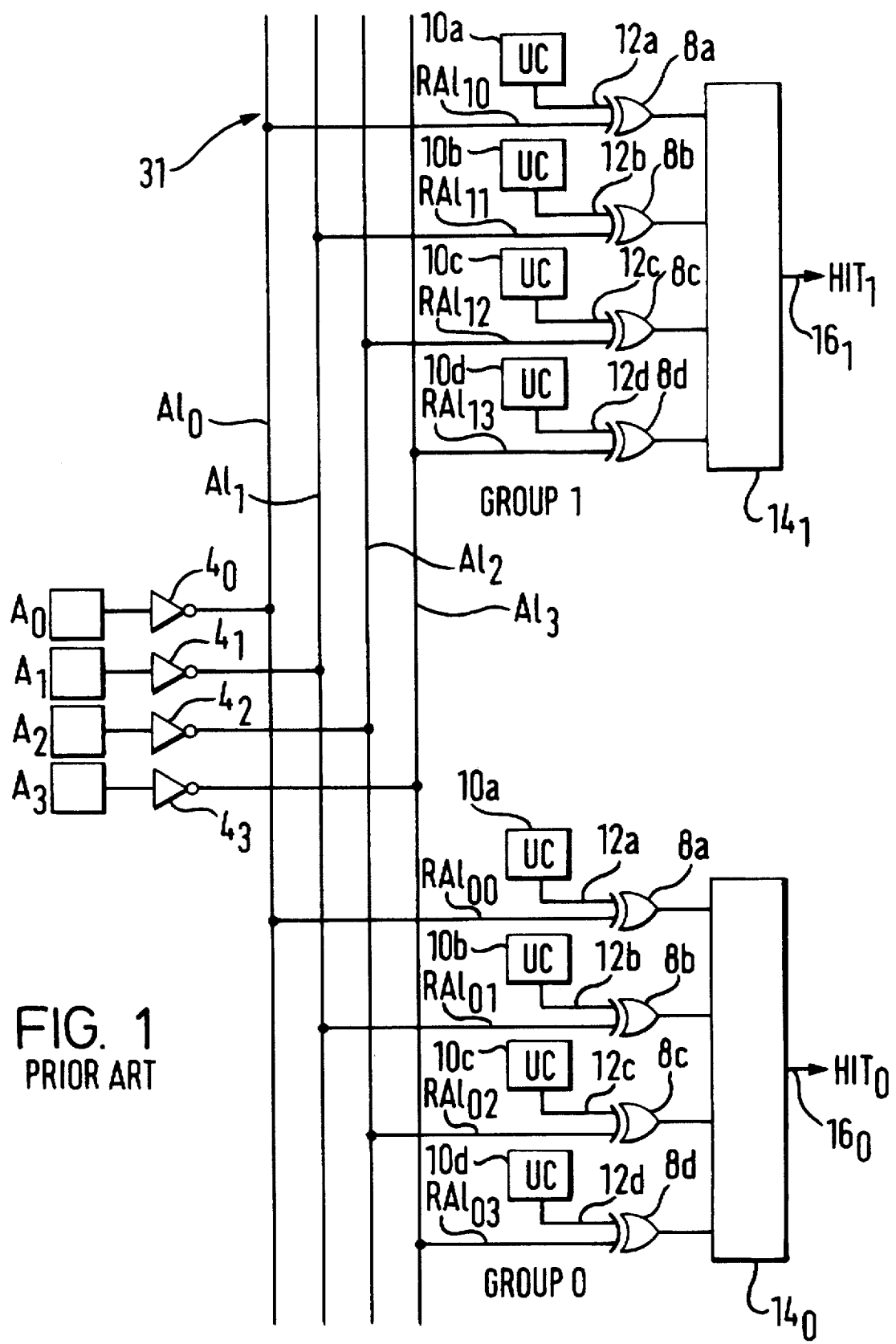
FIG. 1 is a circuit diagram of a known redundancy implementation circuit.
Figure 2:
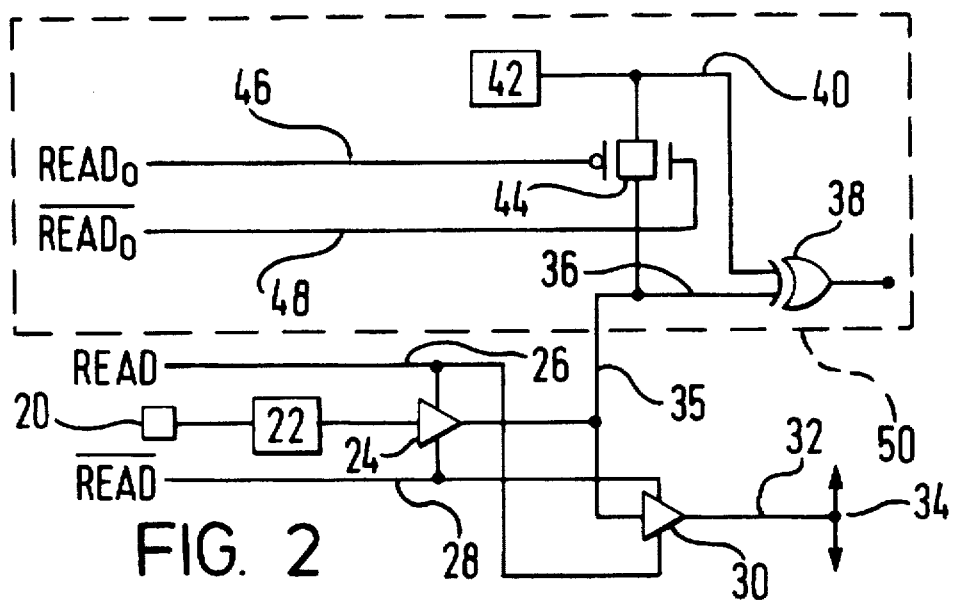
FIG. 2 is a diagram of a redundancy implementation circuit according to the present invention.

There follows a description of how the architecture in FIG. 1 is modified to implement the present invention in its preferred form. FIG. 2 illustrates the case for one address pad and one address line, for example $A_0,AL_0$ in FIG. 1. It will readily be understood that the circuitry is repeated for each address pad. The address pad 20 for receiving address bits is connected to an address buffer 22 the output of which is connected to the redundant address line driver 24 (equivalent for example to $4_0$ in FIG. 1). The redundant address line driver 24 is controlled by complementary READ and $\overline{READ}$ signals on lines 26 and 28 respectively which are set in normal operation of the chips so that the redundant address line driver 24 is on. The READ and READ signals on lines 26 and 28 are also supplied to an output test line driver 30 but with reverse semantics so that when the redundant address line driver 24 is on, the output test line driver 30 is off and vice versa. It will be appreciated that there is a test line driver associated with each address line driver $4_0 \ldots 4_3$. The output test line driver 30 supplies its signals on line 32 to a test IO bus 34 which is connected to an output pad (not shown) in a test mode for supplying signals off chip.

Figure 3:
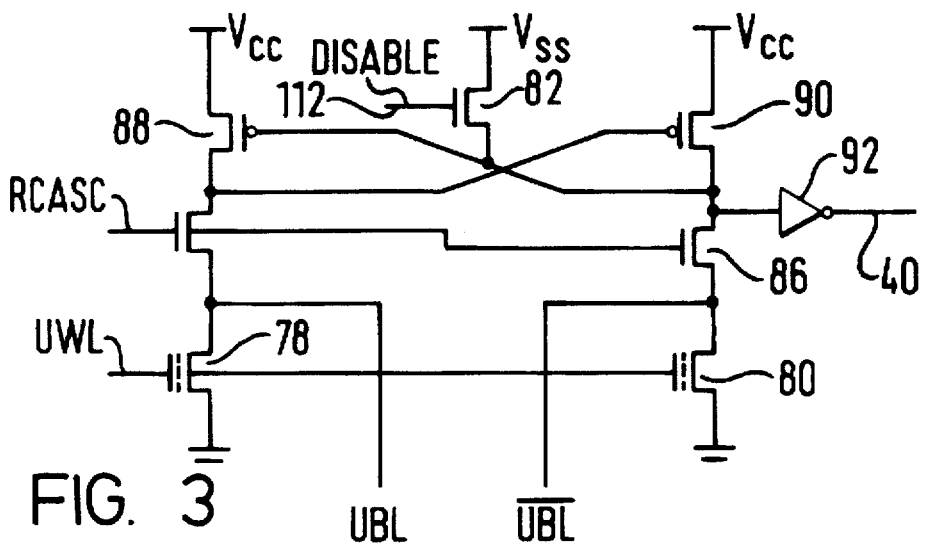
FIG. 3 is a transistor level diagram of one implementation of a UPROM cell.

The redundant address line driver 24 drives the incoming address bit via address line 35 and redundant address line 36 to the input of a comparator 38 (for example equivalent to 8a in FIG. 1). Address line 35 is equivalent for example to $AL_0$ in FIG. 1. Redundant address line 36 is equivalent for example to $RAL_{00}$ or $RAL_1$ in FIG. 1. The comparator 38 receives another input on line 40 from a memory cell 42 (equivalent to memory cell 10a in FIG. 1). In a flash memory chip, the memory cell 42 could be a UPROM cell storing a redundant address bit and having the form shown in FIG. 3. The UPROM cell shown in FIG. 3 comprises first and second floating gate transistors 78,80. The sources of the transistors 78,80 are both connected to ground. The gates of the transistors are connected to a UPROM wordline UWL, which is capable of selectively connecting the gates of the floating gate transistor cells 78,80 to appropriate voltages for programming. The drains of the transistors are connected to bit lines UBL,$\overline{UBL}$ for the cell. The drains of the flash transistors 78,80 are connected through switch transistors 84,86 to a pair of p-channel cross-coupled transistors 88,90 which cooperate to remove DC current in a known manner when the cell is programmed. These cross-coupled transistors are connected in turn to a power supply voltage Vcc. The output 40 of the UPROM cell is taken between the transistor 90 and a switchable transistor 86 via an inverter 92. The gates of the switch transistors 84,86 receive an RCASC signal for activating the cell. During programming RCASC is low to isolate the p-channel transistors 88,90 and transistor 82 drives the p-channel to a known state in response to a disable signal on line 112.

The output of the memory cell 42 on line 40 is also supplied to a switch in the form of a pass gate 44 which is controlled by READ 0 and $\overline{READ\ 0}$ signals on lines 46 and 48 respectively. There is a switch 44 associated with each memory cell in each group. The switches in GROUP0 are all controlled by READ0,$\overline{READ0}$ signals. The switches in GROUP1 are all controlled by different read signals READ1,$\overline{READ1}$ to ensure that the shared address lines are not connected simultaneously to different redundant address lines (e.g. $RAL_{00}$,$RAL_{10}$ in the case of AL0).

The circuitry including the memory cell 42, pass gate 44 and its control lines 46,48 and comparator 38 is shown inside a dotted line 50. It will readily be understood that the circuitry denoted by the dotted line 50 replaces the UPROM cells 10a ... 10d and comparators 8a ... 8d shown in the prior art circuit of FIG. 1. Redundant addresses are stored in the memory cells 42 and the outputs of the comparators 38 are fed in a normal mode of operation to compare circuits to generate hit signals, as discussed above with reference to the prior art. No further discussion of the precise manner of redundancy implementation is given herein because it is well known to a person skilled in the art. It will readily be apparent however that the circuit of FIG. 2 differs from the circuit of FIG. 1 in the provision of a switch 44 associated with each memory cell 42 and in the provision of an output test line driver 30 associated with each address line driver and connected to the shared address line 35.

In normal operation of the memory chip, the READ and $\overline{READ}$ signals on line 26 and 28 are set so that the redundant address line drivers 24 are on. Address bits are supplied via the address pads 20 and address buffers 22 to the comparators 38 and are compared with the outputs of the memory cells 42. When the input addresses match the redundant addresses stored in the memory cells 42, hit signals are generated by the compare circuits.

The invention provides for a special test mode. In this test mode, the READ and $\overline{READ}$ signals change state so that the redundant address line drivers 24 are off and the output test line drivers 30 are on. The output of a selected memory cell 42 can be connected to the redundant address line 36 through the pass gate 44 which is controlled by its control lines 46,48. To select the memory cell 42 shown in FIG. 2, the signals READ 0 and $\overline{READ\ 0}$ would be set appropriately. It will readily be appreciated that each switch 44 is controlled by its control lines 46,48 to selectively supply outputs from the memory cells onto the shared address line 35. These signals are then supplied to the test IO bus 34 via the output test line driver 30. This allows the output of each memory cell 42 to be individually tested without the need for extra routing lines on chip.

Figure 4:
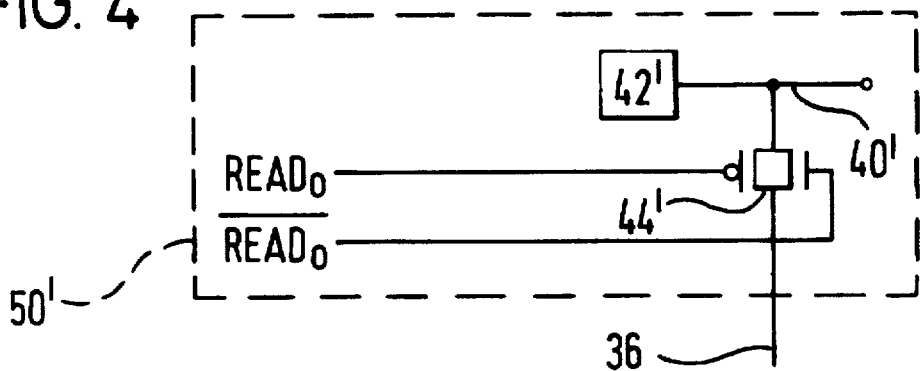
FIG. 4 is a schematic diagram of a modified storage block.

The invention thus allows the redundant address lines to be shared for outputting test data in a test mode onto the test IO bus. The principle of the invention can also be applied where the memory cells 42 are not holding redundancy address information but are holding other bits for controlling operation of the memory device and which are required to be tested. In that case, the output 40 of the memory cell 42 is not supplied to a comparator such as 38 but is supplied directly to another part of the integrated circuit device. FIG. 4 shows a modified block 50' where this is the case. Like parts are denoted by like numerals as in FIG. 2, but primed. The output 40' is similarly connected to the redundant address line 36 for test purposes through the pass gate 44'.

Figure 5:
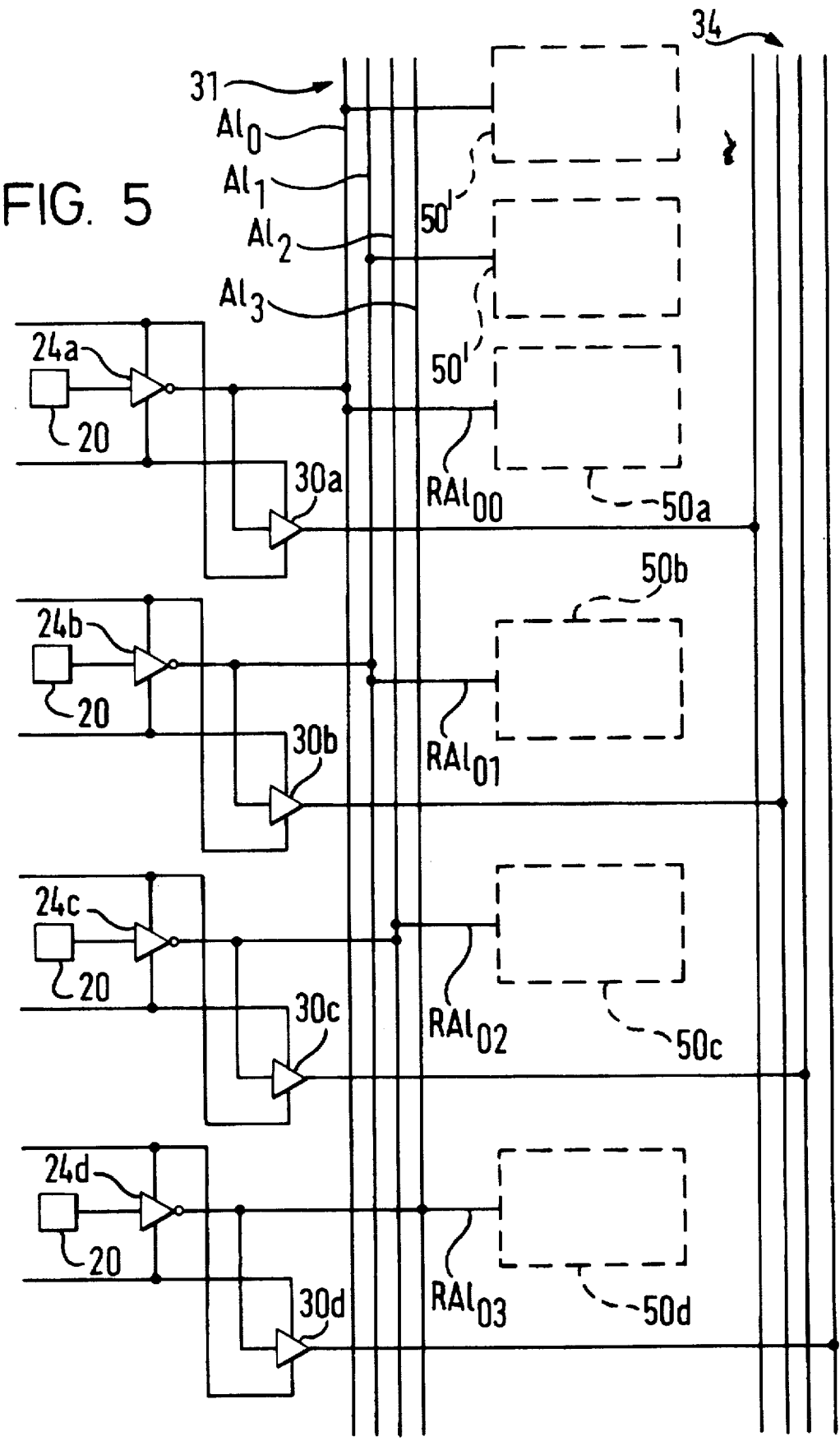
FIG. 5 is a more detailed schematic of one embodiment of the invention.

FIG. 5 is a fuller schematic of the preferred embodiment of the invention implemented for GROUP0 shown in FIG. 1. Like numerals denote like parts as in FIG. 2, with suffixes a ... d corresponding to those in FIG. 1. In addition to blocks 50a ... 50d for implementing redundancy connected respectively to address lines $AL_0$ ... $AL_3$ via redundant address lines $RAL_{00}$ ... $RAL_{03}$, two modified blocks 50' are shown in FIG. 5 connected to address lines $AL_0$ and $AL_1$ respectively. Provided that these address lines $AL_0$ and $AL_1$ are not being used in normal operation of the memory or in a special test mode to output test data from the blocks 50a and 50b, then these modified blocks 50' may have their pass gates 44' selected to place the outputs of the memory cells within the modified blocks 50' onto address lines $AL_0$ and $AL_1$ for outputting through test output drivers 30a and 30b respectively onto the test bus 34.

The address bus 31 and test bus 34 are shown in FIG. 5 as 4 bits wide, but it will be clear that the invention can be implemented for any bus width. Each address line driver drives the address line on the address bus and each test output driver drives one test line on the test bus.

It will be appreciated that while two groups are shown in FIG. 1, the invention can be implemented with any suitable number of groups, provided that no more than one group has access to the common address bus at the same time. This is effected through control of the $\overline{READ0}$ and READ0 signals (for Group 0) and equivalent signals for other groups.

The present invention can be used not only to test chips before use but also to analyse chip failures of returned chips. It can also be used in later tests to establish what data has been programmed into the UPROM cells.

What is claimed is:

1. A redundancy implementation circuit comprising:
   a memory cell storing an address bit of an address identifying a redundant memory location;
   a comparator circuit connected to compare the address bit stored in the memory cell with an incoming address bit supplied on a redundant address line;
   a switch for selectively connecting the output of the memory cell to said redundant address line during a test mode;
   a redundant address line driver activated for supplying an incoming address bit onto said redundant address line in a normal mode; and
   a test line output driver connectable to said redundant address line in a test mode for driving signals on said redundant address line onto a test path when said redundant address line driver is not activated.

2. A redundancy implementation circuit as claimed in claim 1 comprising a plurality of redundant address lines connected to respective address lines of an address bus, the circuit further comprising a plurality of redundant address line drivers and test line output drivers associated respectively with the address lines of the address bus, the redundant address line drivers being connected for driving incoming address bits onto said redundant address lines.

3. A redundancy implementation circuit as claimed in claim 2 which comprises a plurality of said memory cells, each memory cell having associated therewith a respective comparator circuit and a respective switch wherein said plurality of memory cells and corresponding comparator circuits and switches are arranged in a first group, the outputs of said comparator circuits being supplied to a hit generation circuit which generates a hit signal when the incoming address bits match an address identifying a redundant memory location.

4. A redundancy implementation circuit according to claim 3 which comprises at least one further plurality of memory cells and corresponding comparator circuits and switches constituting at least one further group, the outputs of the comparator circuits in said at least one further group being supplied to a further hit generation circuit for generating a hit signal when incoming address bits match an address identifying a further redundant memory location.

5. A redundancy implementation circuit according to claim 4 wherein each address line of the address bus is connected to a redundant address line of each of the first and at least one further group, wherein the redundancy implementation circuit further comprises circuitry for controlling said switches in each group so that the outputs of memory cells in only one of said groups is connected to the address lines of the address bus at one time.

6. A redundancy implementation circuit according to claim 3 which includes a further plurality of memory cells each storing a respective additional bit; and
   a corresponding further plurality of switches for selectively connecting outputs of said further memory cells to said address lines of said address bus during said test mode.

7. A redundancy implementation circuit according to claim 1 implemented on a flash memory chip, wherein said memory cell is a UPROM cell.

8. A redundancy implementation circuit according to claim 3 wherein the redundant address line drivers are connected to receive complementary control signals for turning them on and off and wherein said test line output drivers are connected to receive said complementary control signals but in a reverse sense so that when said redundant address line drivers are on, the test line output drivers are off, and vice versa.

9. A redundancy implementation circuit comprising:
   a memory cell storing an address bit of an address identifying a redundant memory location;
   a comparator circuit connected to compare the address bit stored in the memory cell with an incoming address bit supplied on a redundant address line;
   a switch for selectively connecting the output of the memory cell to said redundant address line during a test mode;
   a redundant address line driver activated for supplying an incoming address bit onto said redundant address line in a normal mode; and
   a test line output driver connectable to said redundant address line in a test mode for driving signals on said redundant address line onto a test path when said redundant address line driver is not activated, wherein the redundant address line driver is connected to receive complementary control signals for turning it on and off and wherein said test line output driver is connected to receive said complementary control signals but in a reverse sense so that when said redundant address line driver is on the test line output driver is off, and vice versa.

10. The redundancy implementation circuit as claimed in claim 8, wherein the redundant address line is one of a plurality of redundant address lines, and wherein the circuit further comprises a plurality of redundant address line drivers and a plurality of test line output drivers each coupled to a corresponding one of the plurality of redundant address lines, the plurality of redundant address line drivers being activated for supplying incoming address bits onto said plurality of redundant address lines.

11. A redundancy implementation circuit as claimed in claim 10, wherein the memory cell is one of a plurality of memory cells, the comparator circuit is one of a plurality of comparator circuits and the switch is one of a plurality of switches, wherein each of said memory cells, comparators and switches corresponds to a respective one of the plurality of redundant address lines, and wherein outputs of said plurality of comparator circuits are supplied to a hit generation circuit that generates a hit signal when the incoming address bits match an address identifying a redundant memory location.

12. A redundancy implementation circuit comprising:
    at least one storage element to store an address bit of an address identifying a redundant memory location;
    at least one comparator arranged to compare the address bit stored in the at least one storage element with an incoming address bit provided on at least one address line during a mode of normal operation; and
    at least one switch, coupled to the at least one storage element, to selectively provide the address bit stored in the at least one storage element to the at least one address line during a test mode of operation.

13. The redundancy implementation circuit as claimed in claim 12, further comprising at least one address line driver having an input to receive the incoming address bit and an output coupled to the at least one address line during the mode of normal operation, the at least one address line driver being controlled to provide the incoming address bit onto the at least one address line during the mode of normal operation, the test mode and the mode of normal operation being at least partially non-overlapping.

14. The redundancy implementation circuit as claimed in claim 13, further comprising a test line output driver, having an input coupled to the at least one address line during a portion of the test mode that is non-overlapping with the mode of normal operation, to provide the address bit stored in the storage element onto a test path during the portion of the test mode that is non-overlapping with the mode of normal operation.

15. The redundancy implementation circuit as claimed in claim 13, wherein the circuit further comprises:
   an address bus having a plurality of bus lines, and
   a plurality of address lines, which includes the at least one address line, each of the plurality of address lines being coupled to one of the plurality of bus lines, and wherein:
      the at least one address line driver includes a plurality of address line drivers,
      each of the plurality of address line drivers is coupled to a corresponding one of the plurality of bus lines during the mode of normal operation, and
      the plurality of address line drivers is controlled to provide the plurality of incoming address bits onto the plurality of address lines during the mode of normal operation.

16. The redundancy implementation circuit as claimed in claim 12, wherein:
   the redundant memory location comprises a first redundant memory location;
   the at least one comparator includes a first group of comparators;
   the at least one switch includes a first group of switches;
   the at least one storage element includes a first group of storage elements;
   each of the first group of storage elements stores a bit of the address identifying the first redundant memory location and is associated with one of the first group of comparators and one of the first group of switches; and
   the redundancy implementation circuit further comprises a first hit generation circuit that is coupled to outputs of the first group of comparators and generates a first hit signal when the plurality of incoming address bits provided on a first group of address lines, which includes the at least one address line, match the address identifying the redundant memory location that is stored in the first group of storage elements.

17. The redundancy implementation circuit as claimed in claim 16, further comprising:
   an address bus having a plurality of bus lines,
   the first group of address lines,
   a second group of address lines that provides the plurality of incoming address bits,
   a second group of comparators,
   a second group of switches,
   a second group of storage elements, each of which stores a bit of an address identifying a second redundant memory location, and has associated therewith one of the second group of address lines, one of the second group of comparators and one of the second group of switches, and
   a second hit generation circuit that is coupled to outputs of the second group of comparators and generates a second hit signal when the plurality of incoming address bits provided on the second group of address lines match the address identifying the second redundant memory location stored in the second group of storage elements; and
   wherein the first and second groups of address lines are both coupled to the address bus.

18. The redundancy implementation circuit as claimed in claim 17, wherein the redundancy implementation circuit further comprises circuitry to control the first and second groups of switches such that address bits stored in only one of the first and second groups of storage elements are provided to the plurality of bus lines of the address bus at one time.

19. The redundancy implementation circuit as claimed in claim 16, further comprising:
   an address bus having a plurality of bus lines,
   the first group of address lines,
   a second group of address lines that provides the plurality of incoming address bits,
   a second group of switches,
   a second group of storage elements, each of which stores a bit of an address identifying a second redundant memory location, and having associated therewith one of the second group of address lines and one of the second group of switches, and
   wherein the first and second groups of address lines are both coupled to the address bus.

20. The redundancy implementation circuit as claimed in claim 12, wherein the at least one storage element, the at least one comparator and the at least one switch are implemented on a flash memory chip, and wherein the at least one storage element is a UPROM cell.

21. The redundancy implementation circuit as claimed in claim 16, further comprising a plurality of test line output drivers, coupled to the first group of address lines during a portion of the test mode, to drive signals on the first group of address lines onto a test path during the portion of the test mode.

22. A redundancy implementation circuit comprising:
   a plurality of storage elements to store address bits of an address representing a redundant memory location;
   at least one comparator arranged to compare the address bits stored by the plurality of storage elements with incoming address bits provided on a plurality of address lines to determine if the incoming address bits match the address bits of the address representing the redundant memory location; and
   means for providing at least one of the plurality of address bits stored in the plurality of storage elements to at least one of the plurality of address lines.

23. The redundancy implementation circuit as claimed in claim 22, further comprising means for selectively providing the incoming address bits onto the plurality of address lines during at least a time interval that the at least one of the plurality of address bits stored in the plurality of storage elements is not provided to the at least one of the plurality of address lines.

24. A method for testing at least one of a plurality of storage elements of a redundancy implementation circuit, each of the storage elements being configured to store an address bit of an address representing at least one redundant memory location, the redundancy implementation circuit being arranged to compare the stored address bits of the address representing the at least one redundant memory location with incoming address bits supplied on a plurality of address lines, the method comprising the step of:

providing an output of the at least one of the plurality of storage elements onto at least one line of a test bus to determine whether the at least one of the plurality of storage elements is functioning properly.

25. The method of claim 24, wherein the step of providing the output of the at least one of the plurality of storage elements onto the at least one line of the test bus includes a step of providing an output of each of the plurality of storage elements to a corresponding line of the test bus.

26. The method of claim 25, wherein the step of providing an output of each of the plurality of storage elements to a corresponding line of the test bus includes a step of providing the output of each of the plurality of storage elements to a corresponding line of an address bus used to provide the incoming address bits compared to the address bits stored in the plurality of storage elements.

* * * * *